United States Patent
Ehlers et al.

(10) Patent No.: US 7,911,066 B2
(45) Date of Patent: Mar. 22, 2011

(54) THROUGH-CHIP VIA INTERCONNECTS FOR STACKED INTEGRATED CIRCUIT STRUCTURES

(75) Inventors: Eric R Ehlers, Santa Rosa, CA (US); Jim Clatterbaugh, Santa Rosa, CA (US); Mathias Bonse, Santa Rosa, CA (US); Timothy E Shirley, Santa Rosa, CA (US); Jerry R Orr, Santa Rosa, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 289 days.

(21) Appl. No.: 11/847,239

(22) Filed: Aug. 29, 2007

(65) Prior Publication Data

US 2009/0057872 A1    Mar. 5, 2009

(51) Int. Cl.
*H01L 23/48* (2006.01)
*H01L 23/52* (2006.01)
*H01L 29/40* (2006.01)

(52) U.S. Cl. .................................. 257/778; 257/774
(58) Field of Classification Search .................. 257/778, 257/774, 758

See application file for complete search history.

(56) References Cited

U.S. PATENT DOCUMENTS

| | | | | |
|---|---|---|---|---|
| 5,640,051 | A | * | 6/1997 | Tomura et al. ............... 257/778 |
| 6,222,276 | B1 | * | 4/2001 | Bertin et al. ................. 257/778 |
| 6,365,975 | B1 | * | 4/2002 | DiStefano et al. ........... 257/777 |
| 2001/0001292 | A1 | * | 5/2001 | Bertin et al. ................. 438/107 |

* cited by examiner

*Primary Examiner* — David A Zarneke
*Assistant Examiner* — Jenny L Wagner

(57) ABSTRACT

A stacked IC structure has an integrated circuit (IC) having a front IC side, a back IC side, and a first conductive feature formed on the front IC side. A through-chip via connects to the first conductive feature on the front IC side. A substrate has an external circuit formed on a front surface. The IC attaches to the front surface of the substrate and the through-chip via forms a connection between the first conductive feature and the external circuit.

20 Claims, 14 Drawing Sheets

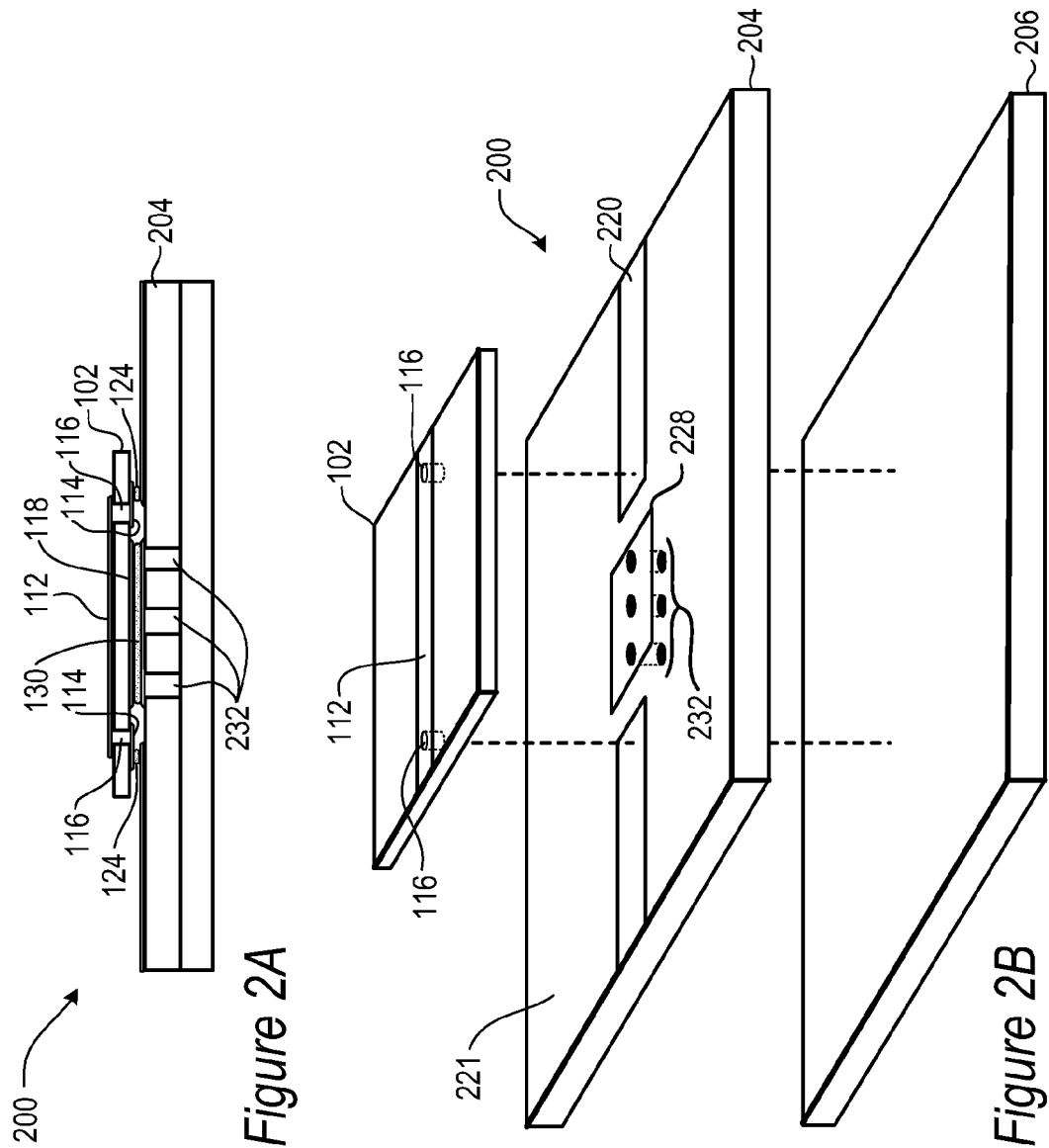

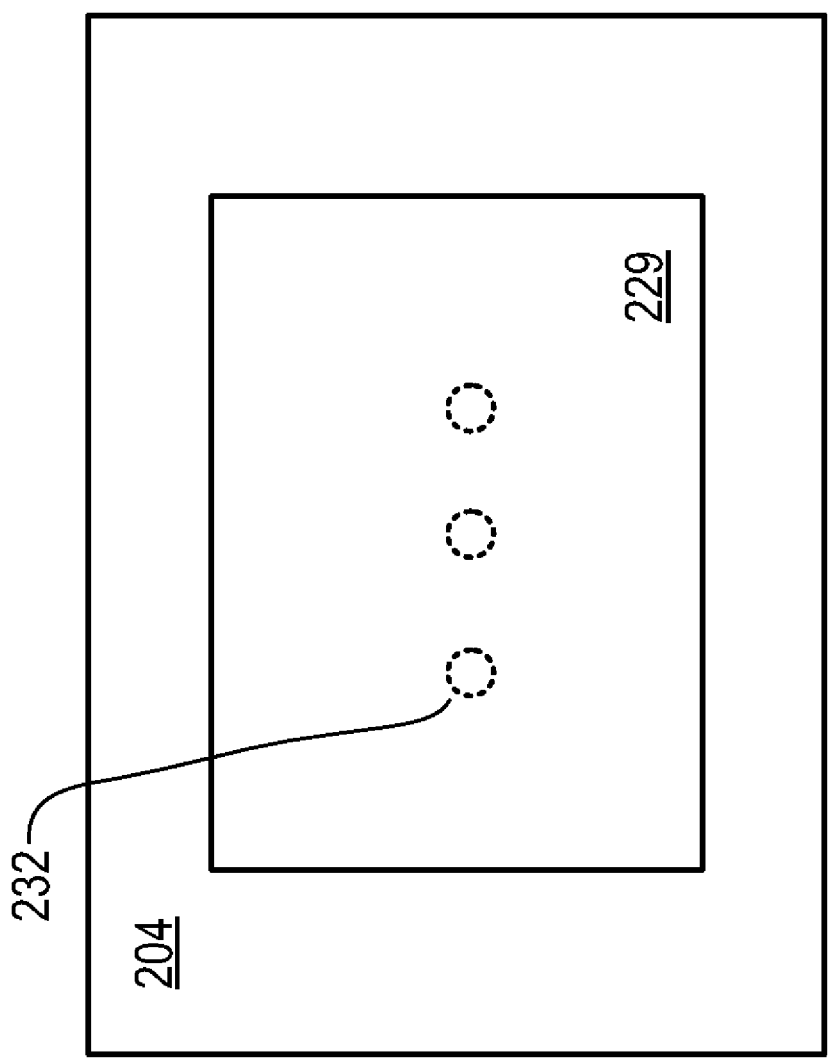

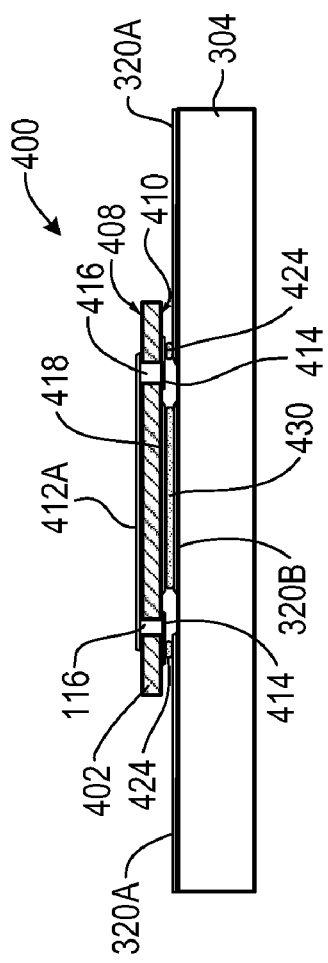
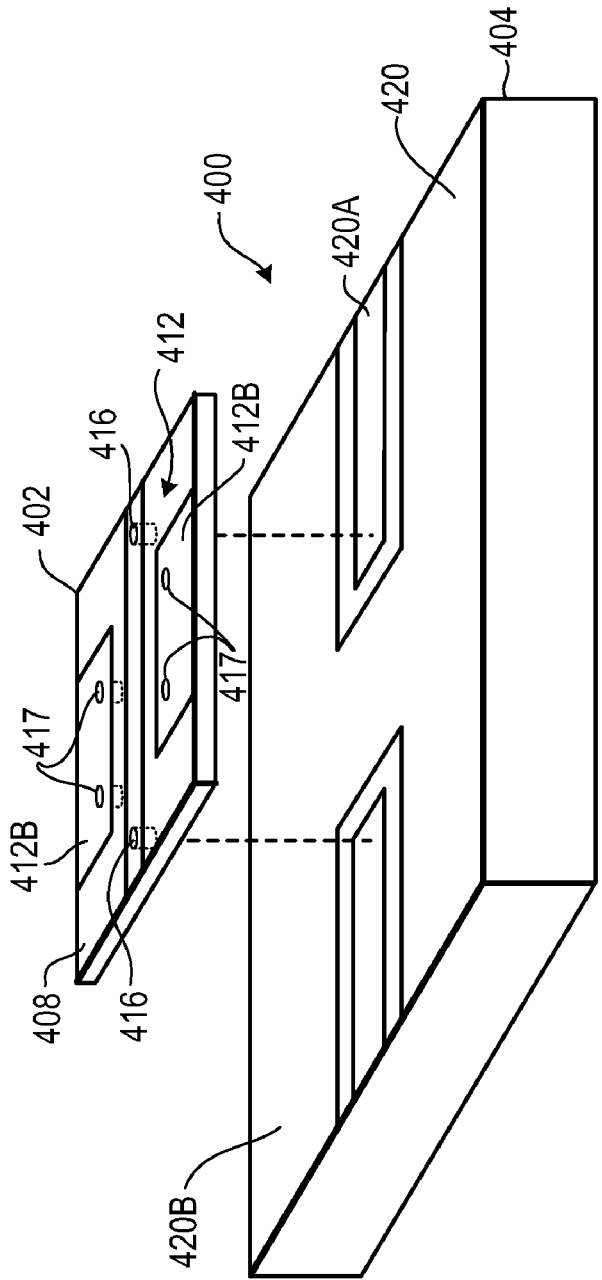
Figure 4A
Figure 4B

THROUGH-CHIP VIA INTERCONNECTS FOR STACKED INTEGRATED CIRCUIT STRUCTURES

BACKGROUND

Integrated circuits are attached to external circuits with interconnects. The most widely used interconnect is the wire bond. Single or multiple wire bonds connect the bond pads on the integrated circuit to external network terminals which are typically package pins or printed circuit traces. One disadvantage of wire bonds is the parasitic inductance associated with long bond wires. The parasitic inductance introduced by wire bonds is especially problematic in high frequency applications. Another disadvantage to wire bonds is the variability of the wire length and position relative to the circuits and ground planes, and the variability in positioning the chip with respect to the external circuit.

One method of reducing interconnect inductance and variability is to use ribbon or mesh instead of wire bonds. However, parasitic inductance is still an issue, and there are additional equipment and assembly costs associated with ribbon bonders. Furthermore, mesh bonds typically require expensive hand assembly.

Another type of interconnect used to reduce inductance is a beam lead. Connecting integrated circuits with beam leads is effective in reducing inductance, but hand assembly is typically required, and beam leaded integrated circuits require special processing and handing. Extra die area is required for beam leads, which increases circuit costs. Furthermore, beam lead attachment is not compatible with a standard low-cost package. In addition, since the circuit is attached through the beams, the thermal resistance of the attachment is high compared to conventional epoxy or solder attach of the backside of the chip to a package floor.

Flip-chip die attachment solves many of the problems associated with bonds, ribbon or mesh and beam leads. Parasitic inductance is very low and die placement can be very precise with automated equipment. However, a significant disadvantage is the high thermal resistance. Heat flows from the circuit to the package or ground through a limited number of attachment pads, making flip-chips unsuitable for circuits such as power amplifiers which require good heat sinking. Also, since the circuit is upside down after attachment, the circuit is not accessible, which may be a disadvantage for some applications.

BRIEF DESCRIPTION OF THE DRAWINGS

FIG. 1A is a cross-sectional view of the stacked IC structure, FIG. 1B is an exploded view, and FIG. 1C is a bottom view of an IC in the stacked IC structure.

FIGS. 2A-2C show different views of a stacked IC structure having a heat dissipation path that passes through the substrate. FIG. 2A is a cross-sectional view, FIG. 2B is an exploded view, and FIG. 2C is a bottom view.

FIG. 3A is a cross-sectional view and FIG. 3B is an exploded view.

FIGS. 4A-4C show different views of a stacked IC structure having a coplanar waveguide-over-ground to a coplanar waveguide transition. FIG. 4A is a cross-sectional view, FIG. 4B is an exploded view, and FIG. 4C is a bottom view of an IC in FIGS. 4A-4B.

FIG. 5A is a cross-sectional view, FIG. 5B is an exploded view, FIG. 5C is a bottom view of an IC in FIGS. 5A-5B, and FIG. 5D is a bottom view of a substrate in FIGS. 5A-5B.

FIG. 6A is a cross-sectional view, and FIG. 6B is an exploded view. FIG. 5C also is a bottom view of a first and second IC in FIGS. 6A-6B.

Note that the drawings in the figures are not to scale.

DETAILED DESCRIPTION

In a stacked integrated circuit structure, interconnections between conductive features (e.g. transmission lines, data lines, signal traces, bias lines, contact pads, ground planes, etc.) on an integrated circuit (IC) and an external circuit (external to the IC) are formed using a through-chip via in the IC. A conductive feature on a front side of the IC is coupled to a conductive feature on the back side of the IC using a through-chip via. The external circuit is formed on a front surface of a substrate. The word "substrate" shall be used hereinafter to refer to a supporting material on which a circuit is formed or fabricated. The IC is stacked onto the substrate so that the external circuit and the back side conductive feature are aligned. A conductive bond is formed between the external circuit and the back side conductive feature on the IC, thus completing the interconnection between the external circuit and the conductive feature on the front side of the IC.

The through-chip vias have low parasitic inductance, so signal traces in the stacked IC structure are suitable for high frequency operation. The term "high frequency" is used hereinafter to refer to microwave frequencies greater than 20 gigahertz (GHz), Furthermore, the through-chip vias are created using semiconductor fabrication processes, which have good precision and less variability. Additionally, the front of the IC remains accessible when it is stacked and connected to the substrate using through-chip vias. It is easier to perform testing on an IC with an accessible front, and additional conventional wire bonds can still be used if desired for interconnects that do not require the electrical advantages of through-chip vias (e.g. bias lines).

Stacked IC Structure

Figure 1A:
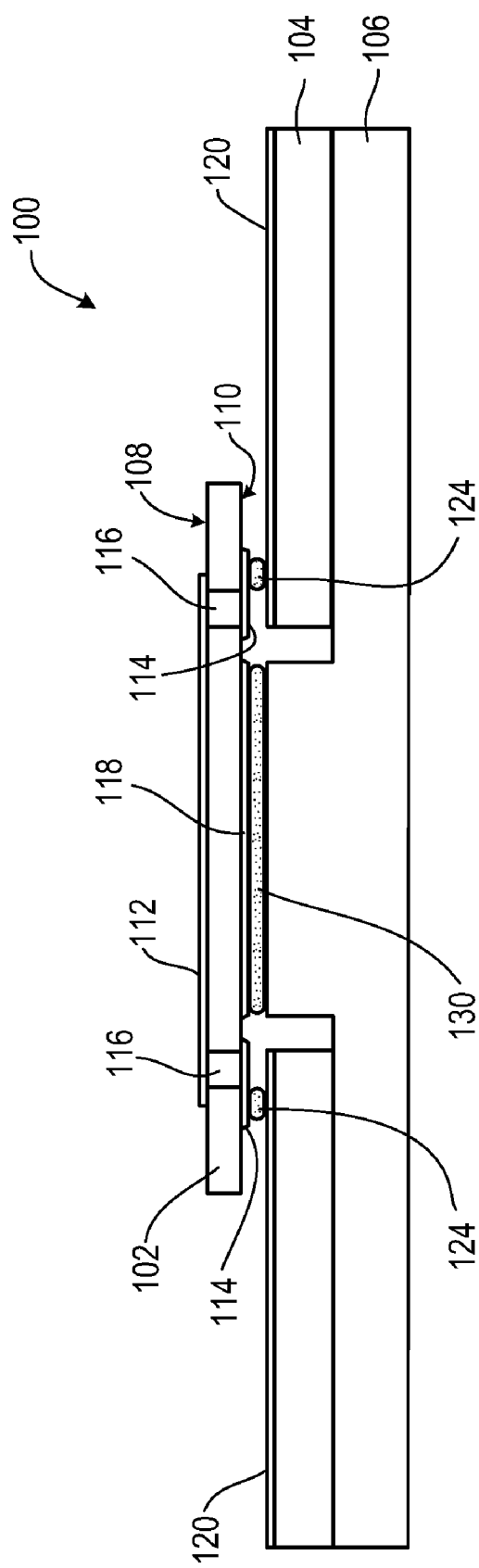
FIGS. 1A-1C show different views of a stacked IC structure.
Figure 1B:
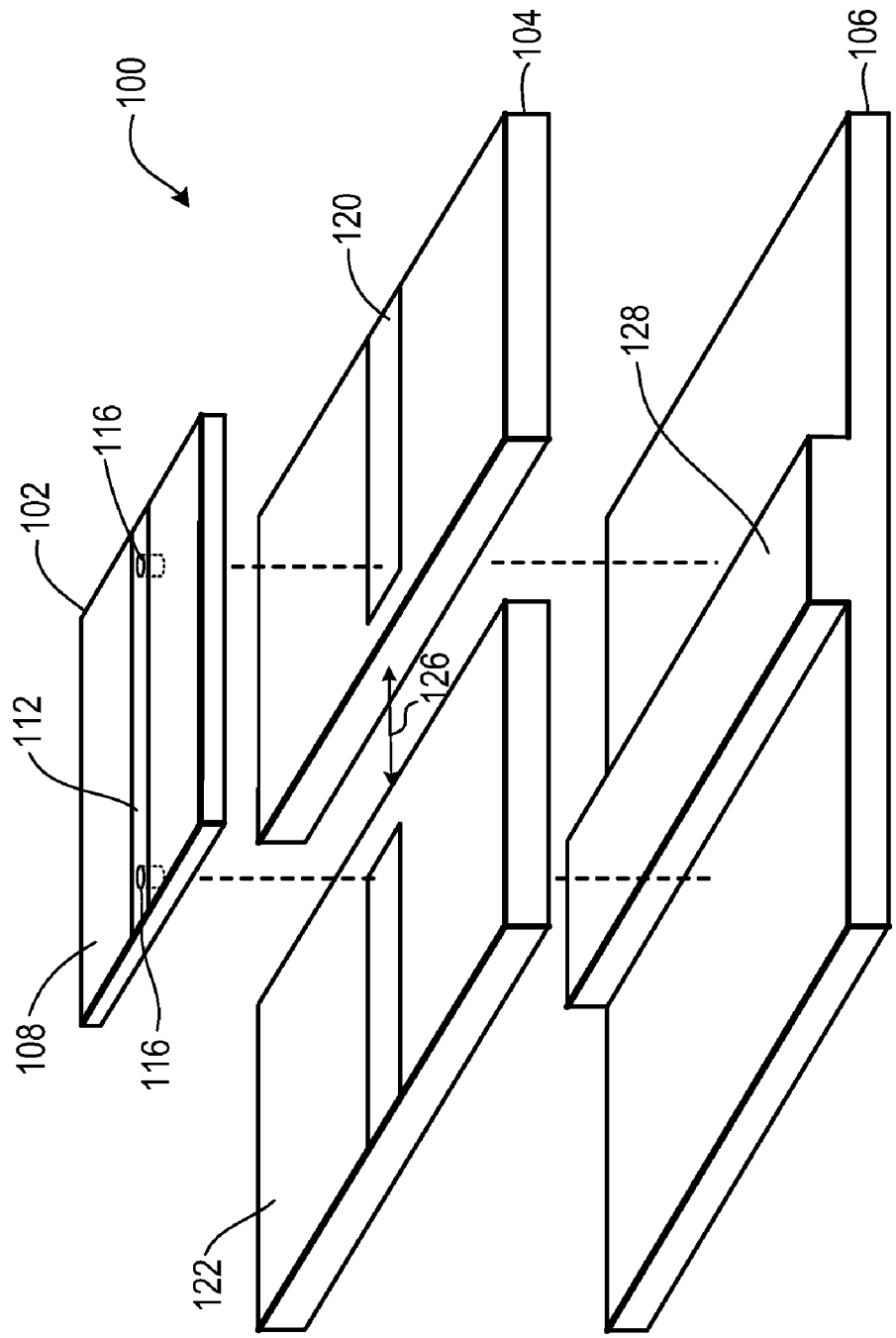
Figure 1C:
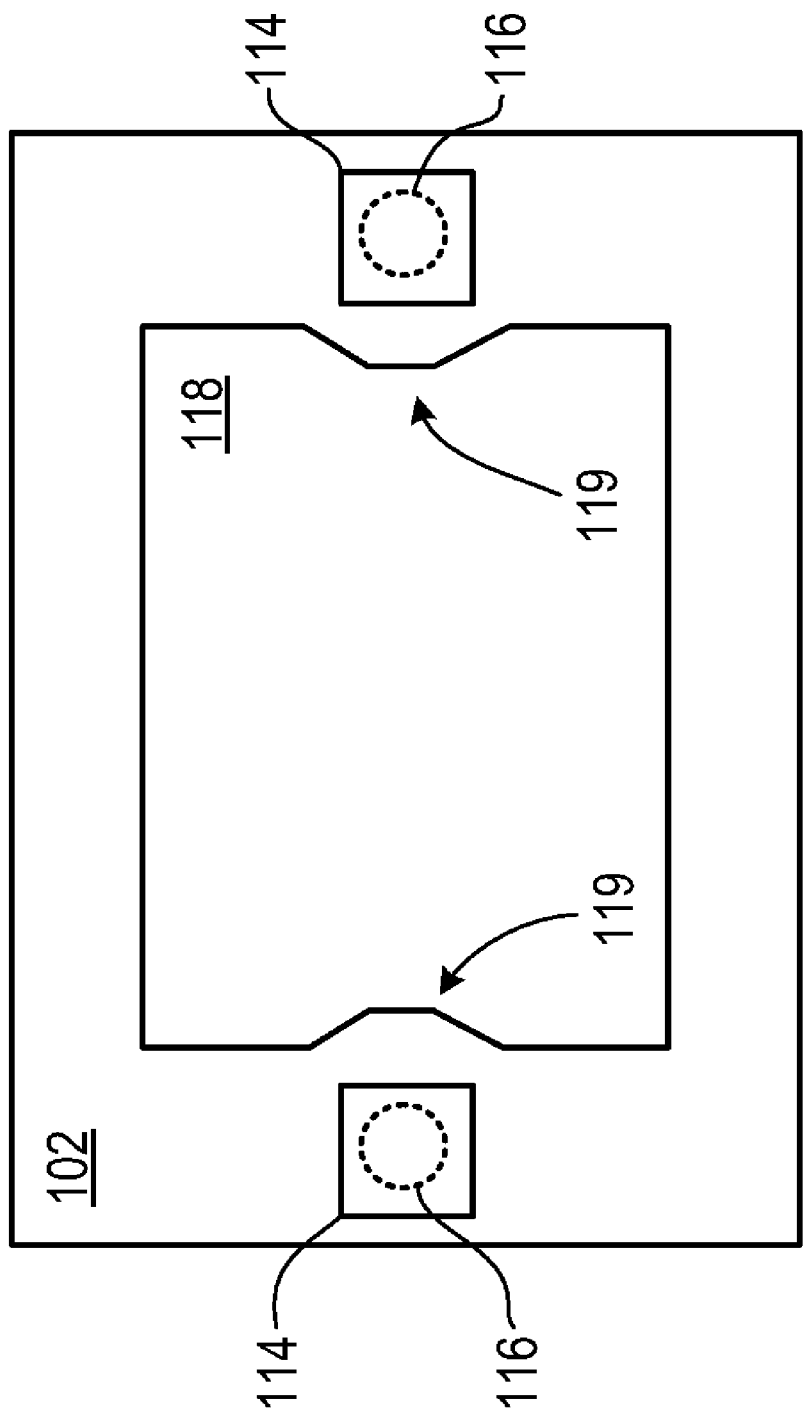

Refer now to FIGS. 1A-1C, which show different views of one embodiment of a stacked IC structure 100. FIG. 1A is a cross-sectional view of the stacked IC structure 100, and FIG. 1B is an exploded view. FIG. 1C is a bottom view of an IC 102 in the stacked IC structure 100.

The stacked IC structure 100 includes the IC 102, a substrate 104, and a package 106. The IC 102 has a front side 108 and a back side 110. The IC 102 is typically a semiconductor (such as silicon, gallium arsenide, indium phosphide, gallium nitride, etc.) with a conductive feature such as a signal trace 112 formed on the front side 108. The IC 102 can also be any dielectric or insulating material (e.g. diamond) that has a semiconductor material bonded or grown on the top. In FIGS. 1A-C, the signal trace 112 is shown as a simple microstrip transmission line to represent a high-frequency signal path. However, different types of signal traces can be used, such as inductors and capacitors and other kinds of transmission lines (e.g. stripline, coplanar waveguides, coplanar waveguides over ground and coplanar strips), as will be discussed in more detail below. Contact pads 114 are formed on the back side of the IC 102. Through-chip vias 116 are formed between the front side 108 and the back side 110 to connect the signal trace 112 to each contact pad 114. In the figures, only two through-chip vias 116 are shown for the sake of simplicity. The through-chip vias 116 are typically placed around the periphery of the IC to allow for heat conduction from the center of the IC to the package floor. However, through-chip vias 116 can be placed anywhere on the IC if needed. In an actual reduction to practice, the through-chip via 116 was plated with conductive material on the sidewalls only; however, solid through-chip vias (filled with conductive material) can also be used. If a solid through-chip via is used, it may be possible to omit the contact pad 114 if the solid through-chip via is large enough.

A ground plane 118 is formed on the back side 110 of the IC 102 (see FIG. 1C). The ground plane 118 is made of conductive metal, such as gold. The conductive features on the backside of the IC 102 are patterned to avoid shorting one contact pad 114 to another or to the ground plane 118. The ground plane 118 shields the signal on the signal trace 112 from noise and establishes the ground planes required for transmission lines. It also transfers heat away from the IC 102, as will be discussed further below. The ground plane 118 may include adjustments 119. The adjustments 119 are used to set a distance between the ground plane 118 and the through-chip vias 116. The shape and size of the adjustments 119 are chosen to optimize the transition of the signal from the signal trace 112 on the IC, through the through-chip vias 116, to the circuit 120. The optimization is performed to match impedances and minimize reflections at the transition interfaces between the signal trace 112, through-chip vias 116, and the circuit 120. The shape and size of the adjustments can be determined using computer simulation, as described in more detail below.

The substrate 104 has a circuit 120 formed on its front surface 122. The circuit 120 shown in FIGS. 1A-1B is a transmission line, although other types of circuits may also be used, as will be discussed further below. In the embodiment shown, the substrate 104 is a printed circuit board. The substrate 104 can also be a thin or thick film circuit on a ceramic material. The substrate 104 can also be another IC, as will be discussed further below.

The IC 102 is stacked onto the substrate 104 with sufficient accuracy so that the contact pads 114 are aligned with the intended contact regions on circuit 120. The front side 108 of the IC 102 remains unobstructed by the substrate 104. The IC 102 is connected to the substrate 104 using conductive bonds 124 between the contact pads 114 and the circuit 120.

The conductive bonds 124 can be made with conventional conductive epoxy or solder paste. Both conductive epoxy and solder paste can be applied by hand or by machine. Using solder paste helps align the IC 102 to the substrate 104, due to the self-alignment properties of solder. Solder preforms can also be used in applying the solder. These conductive bonds 124 complete the electrical interconnection between the signal trace 116 and the circuit 120, and also mechanically connect the IC 102 to the substrate 104.

The conductive bonds 124 can also be made by plating metal (in the form of bumps, balls or posts) on the IC 102 or on the substrate 104. Then, a thermosonic die attach process is used to connect the IC to the substrate both electrically and mechanically. The thermosonic die attach process applies a combination of heat and ultrasonic energy to the conductive bonds 124, fusing the IC 102 to the substrate 104.

In this manner, the center conductor 112 is connected to the circuit 120 on the substrate. Since the through-chip vias 116 have low parasitic inductance, the signal traces in the stacked IC structure 100 are well-suited to high frequency operation. The electrical interconnection between the signal trace and the circuit (by way of the though-chip vias) can be optimized for high frequency operation. The amount and kind of optimization needed can be determined by modeling the through-chip via 116 in a computer simulation, using a computer program such as a 3-dimensional electromagnetic field solver—an example of one such program is the Agilent High Frequency Structure Simulator. Optimization can be implemented by using conventional microwave matching elements (such as inductors and capacitors) on the IC 102 or on the substrate 104. Optimization can also be implemented by varying the size of the through-chip vias 116, and changing the distance of the ground plane 118 from the through-chip vias and signal traces 112. In an actual reduction to practice, performance up to 100 GHz has been demonstrated.

The substrate 104 and IC 102 are housed in the package 106. Only a portion of the package 106 is shown. The substrate 104 is attached to the package, using epoxy or any other suitable adhesive material. The substrate 104 may also have additional bonding pads that are wire bonded to input/output pins on the package 106, although this is not shown in the figures. The substrate 104 has a cutout 126 through which a pedestal 128 protrudes from the floor of the package 106 to connect to the ground plane 118 on the IC 102. This pedestal 128 provides a path for heat dissipation during operation of the IC 102, and the package 106 functions as a heat sink. A grounding bond 130 between the IC 102 and the pedestal 128 can be formed and joined at the same time as the conductive bonds 124 are formed and joined, or at a later time. The grounding bond 130 can be made of solder, conductive epoxy or other conductive material. The grounding bond 130 provides an electrical connection to ground for the IC 102, and a thermal connection for heat dissipation of the IC. For example, in some applications (e.g. thermocouple power detectors), an electrical or thermal insulator may also be desired. In some applications, it may be desirable to have a poor heat conductor, or a poor electrical conductor, e.g. thermocouple power detector where heat dissipation is not necessarily desired]

Stacked IC Structure with Heat Dissipation Through Substrate

In another embodiment, a heat dissipation path travels through a portion of the substrate. Refer now to FIGS. 2A-C, which show different views of a stacked IC structure 200 having a heat dissipation path that passes through the substrate. FIG. 2A is a cross-sectional view of the stacked IC structure 200 and FIG. 2B is an exploded view. FIG. 2C is a bottom view of a substrate 204 in the stacked IC structure 200

The stacked IC structure 200 includes an IC 102, a substrate 204, and a package 206. The IC 102 is formed with a signal trace 112, contact pads 114, through-chip vias 116, and a ground plane 118 as described above for FIGS. 1A-1C. The substrate 204 has a circuit 220 formed on its front side 221. The IC 102 is stacked onto the substrate 204 with sufficient accuracy so that the contact pads 114 are aligned to the circuit 220. The contact pads 114 are connected to the circuit 220 using conductive bonds 124 as described above for FIGS. 1A-1C. The substrate 204 no longer has a cutout for a pedestal from the package floor. Instead, a substrate pad 228 is formed on a portion of the substrate 204, located opposite and facing the ground plane 118 on the IC. Conductive vias 232 are formed in the substrate pad 228 that connect the substrate pad 228 to the back surface of the substrate 204. The conductive vias 232 are created using conventional processes, such as those used for printed circuit board processes, or thin/thick film on ceramic manufacturing processes. The conductive vias 232 connect to a substrate ground plane 229 on the backside of the substrate 204.

The IC 102 is bonded to the substrate 204 with conductive bonds 124 as described previously. A grounding bond 130 is also formed between the ground plane 118 and the substrate pad 228. Conductive bonds 124 and grounding bond 130 are formed and joined at the same time. Once the IC 102 and substrate 204 are joined together, they are placed into the package 206. The substrate 204 can contact the package 206 in several ways. The substrate 204 and package 206 can be bonded together with conductive epoxy, solder or other conductive material. The substrate 204 can also be mechanically held in place with a heat conductive paste or a compressible conductive film.

The conductive vias 232 provide both a ground path and a heat dissipation path between the IC 102 and the package 206. This allows for a less expensive package since it can now have a flat floor. This embodiment allows for easier assembly as well, since the bottom of the IC 102 attaches to a flat surface. However, the ground inductance and thermal resistance are increased to some extent since the ground plane 118 of the IC is not in direct contact with the package 204 anymore.

Stacked IC Structure with Substrate Coplanar Waveguide

Figure 3A:
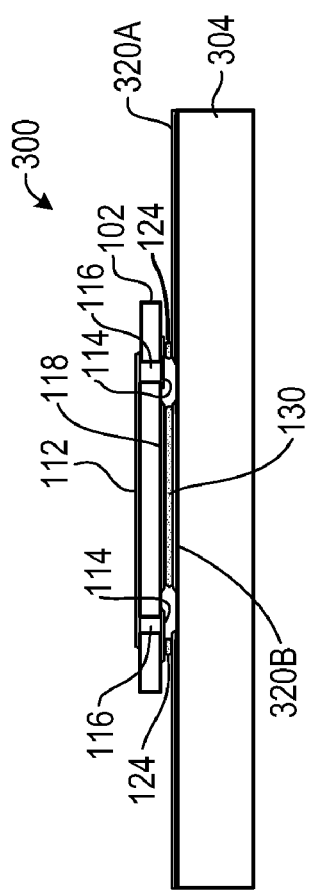
FIGS. 3A-3B show different views of a stacked IC structure having a coplanar waveguide.
Figure 3B:
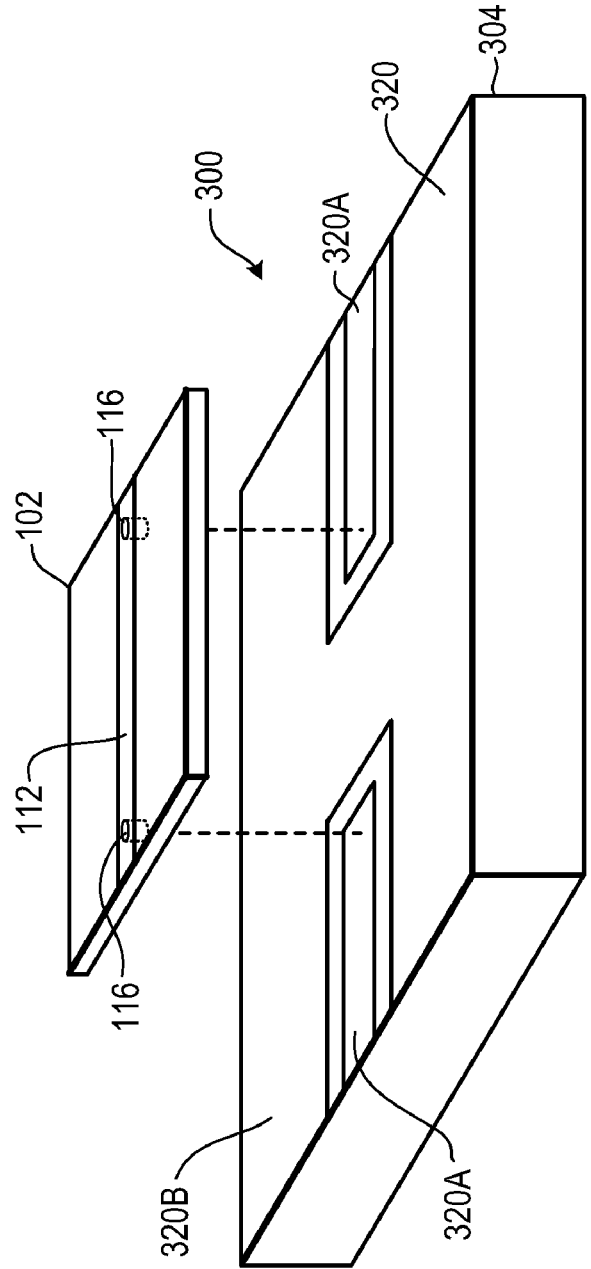

Many other types of circuits may be used on a substrate and connected to signal traces on an IC using through-chip vias. For example, FIGS. 3A-B show a stacked IC structure 300 having a coplanar waveguide on a substrate. FIG. 3A is a cross-sectional view of the stacked IC structure 300, and FIG. 3B is an exploded view of the same stacked IC structure 300.

The stacked IC structure 300 includes an IC 102 and a substrate 304. The IC 102 and substrate 304 may also be housed in a package which is not shown in the figures, since embodiments describing the package and attachment to the package have already been described. The IC 102 is formed with a signal trace 112, contact pads 114, through-chip vias 116, and a ground plane 118 as described above for FIGS. 1A-1C and 2A-2C. The substrate 304 has a coplanar waveguide (CPW) 320 formed on its surface. Only a portion of the CPW 320 is shown since CPWs are well-known in the art. The CPW 320 has center conductors 320A and an outer conductor 320B. The signal trace 112 is connected to the center conductor 320A using conductive bonds 124 formed between the contact pads 114 and the center conductor 320A. These conductive bonds 124 can be made with conventional conductive epoxy or solder; or plated bumps, balls, or posts as described above for the previous embodiments. Additionally, a conductive bond 130 joins the ground plane 118 to the outer conductor 320B. The size of the conductive bond 130 and ground plane 118 will depend on the application, but should be made large enough to provide for adequate heat transfer between the IC 102 and the substrate 304. Furthermore, the dimensions of the conductive bond 130 are chosen so as not to perturb the transmission line properties of the signal traces on the IC 102 and substrate 304. In this embodiment, heat flows primarily sideway through the outer conductor 320B on the substrate 304, although some heat may also flow through the substrate itself.

Stacked IC Structure with CPW-Over-Ground to CPW Transition

Figure 4C:
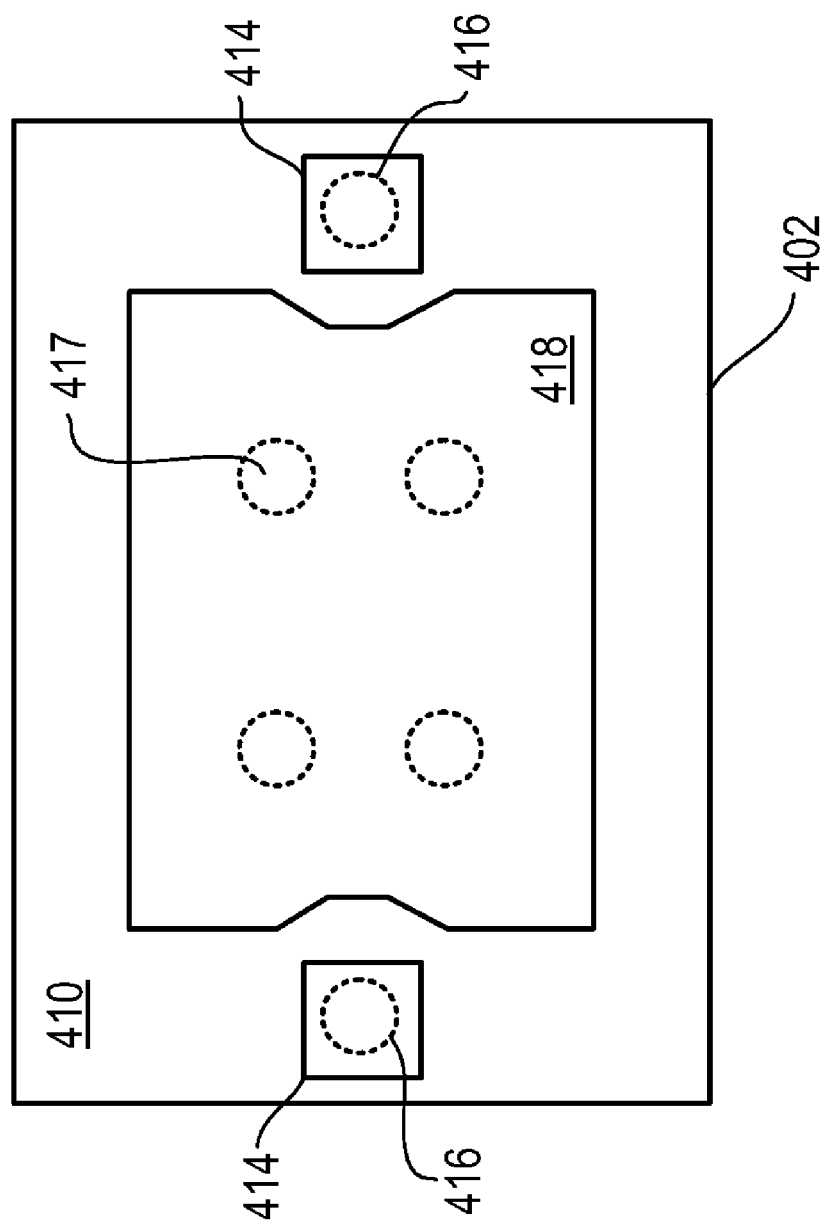

Many other types of signal traces may be used on an IC and connected to a circuit on a substrate using through-chip vias. For example, FIGS. 4A-4C, which show different views of a stacked IC structure 400 having a CPW-over-ground on an IC that transitions to a CPW on a substrate. FIG. 4A is a cross-sectional view of the stacked IC structure 400, FIG. 4B is an exploded view of the stacked IC structure 400, and FIG. 4C is a bottom view of just the IC in the stacked IC structure 400.

The stacked IC structure 400 includes an IC 402 and a substrate 404. The IC 402 and substrate 404 may also be housed in a package which is not shown in the figures, since embodiments describing the package and attachment to the package have already been described. The IC 402 has a front side 408 and a back side 410. A coplanar waveguide-over-ground (CPW-over ground) 412 is formed on the front side 408. The CPW-over-ground 412 includes a center conductor 412A and outer conductors 412B. Contact pads 414 and a ground plane 418 are formed on the back side 410 of the IC 402. Through-chip vias 416 connect the center conductor 412A to each contact pad 414.

Through-chip vias may also be used to connect ground signals and facilitate heat transfer between components. FIG. 4B shows through-chip vias 417 that connect the outer conductors 412B to the ground plane 418. The number of through-chip vias 417 that are needed will depend on the application. Generally, enough through-chip vias 417 should be used to provide enough heat flow from the IC 402 to the ground plane 418 and the substrate 404, and to prevent undesired electrical modes.

The substrate 404 has a CPW 420 formed on its surface as described for FIGS. 3A-3B. The substrate CPW 420 includes center conductors 420A and an outer conductor 420B. The IC 402 is connected to the substrate 404 using conductive bonds 424 between the contact pads 414 on the IC 402 and the center conductor 320A on the substrate CPW. An additional connection is made using a conductive bond 430 between the ground plane 418 on the IC and the outer conductor 320B on the substrate. By using through-chip vias 416, the center conductor 412A on the IC can be connected to the center conductor 320A on the substrate. The outer conductors 412B on the IC, the ground plane 418 on the IC, and the outer conductor 420B on the substrate are also interconnected, using through-chip vias 417 and conductive bond 430.

Stacked IC Structure with CPW-Over-Ground to CPW-Over-Ground Transition

Figures 5A, 5B:
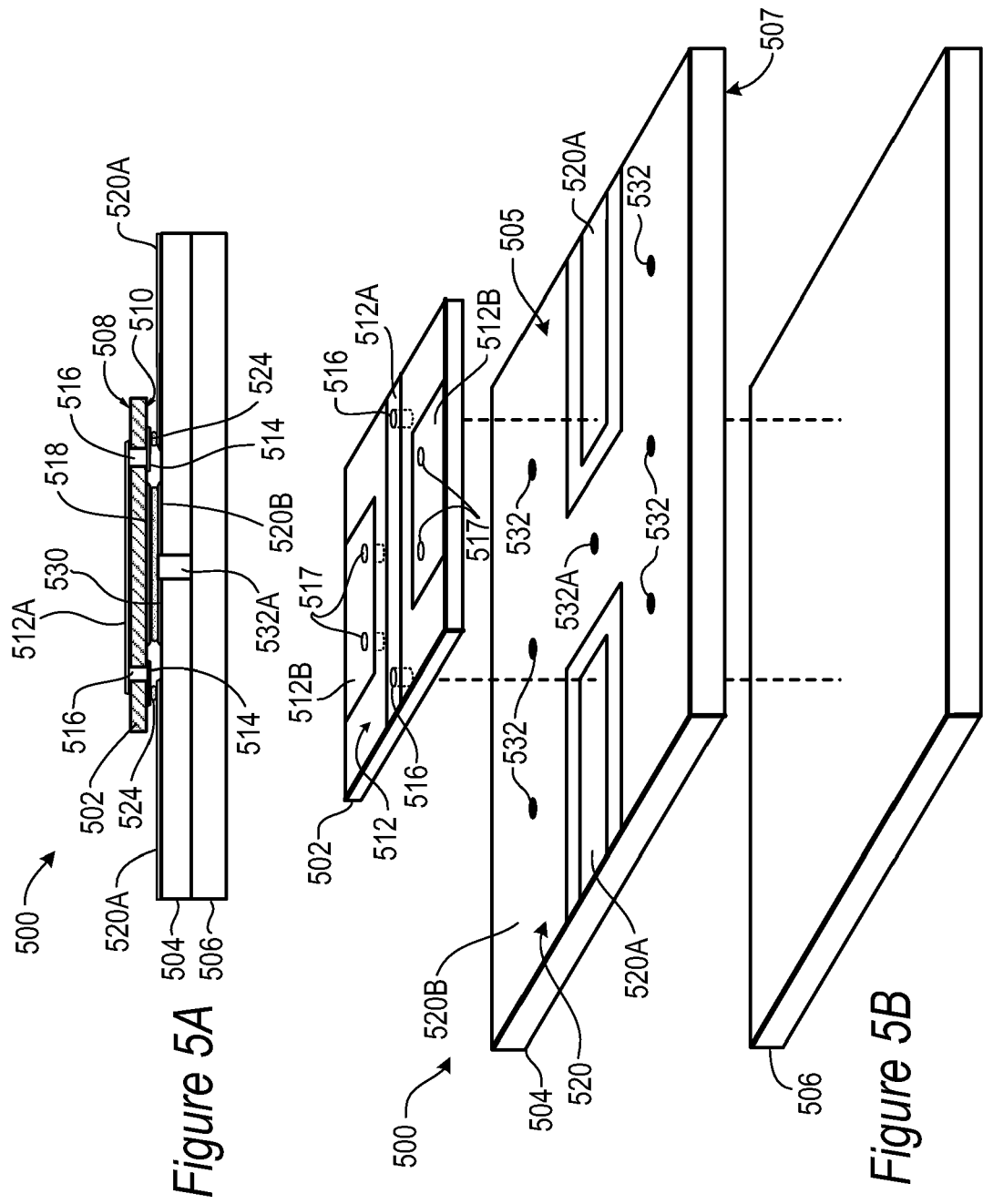
FIGS. 5A-5D show different views of a stacked IC structure having a coplanar waveguide-over-ground to a coplanar waveguide-over-ground transition.
Figure 5C:
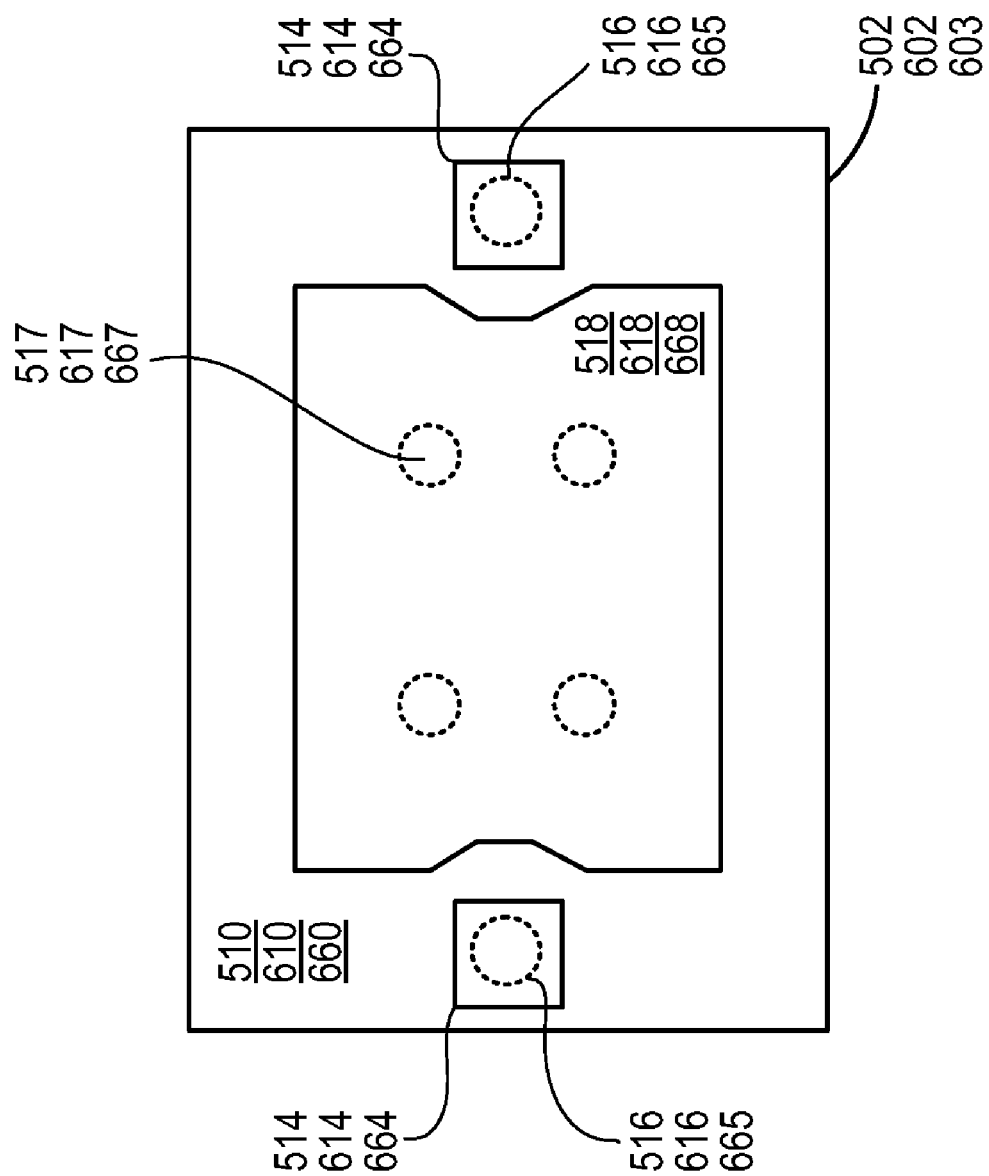
Figure 5D:
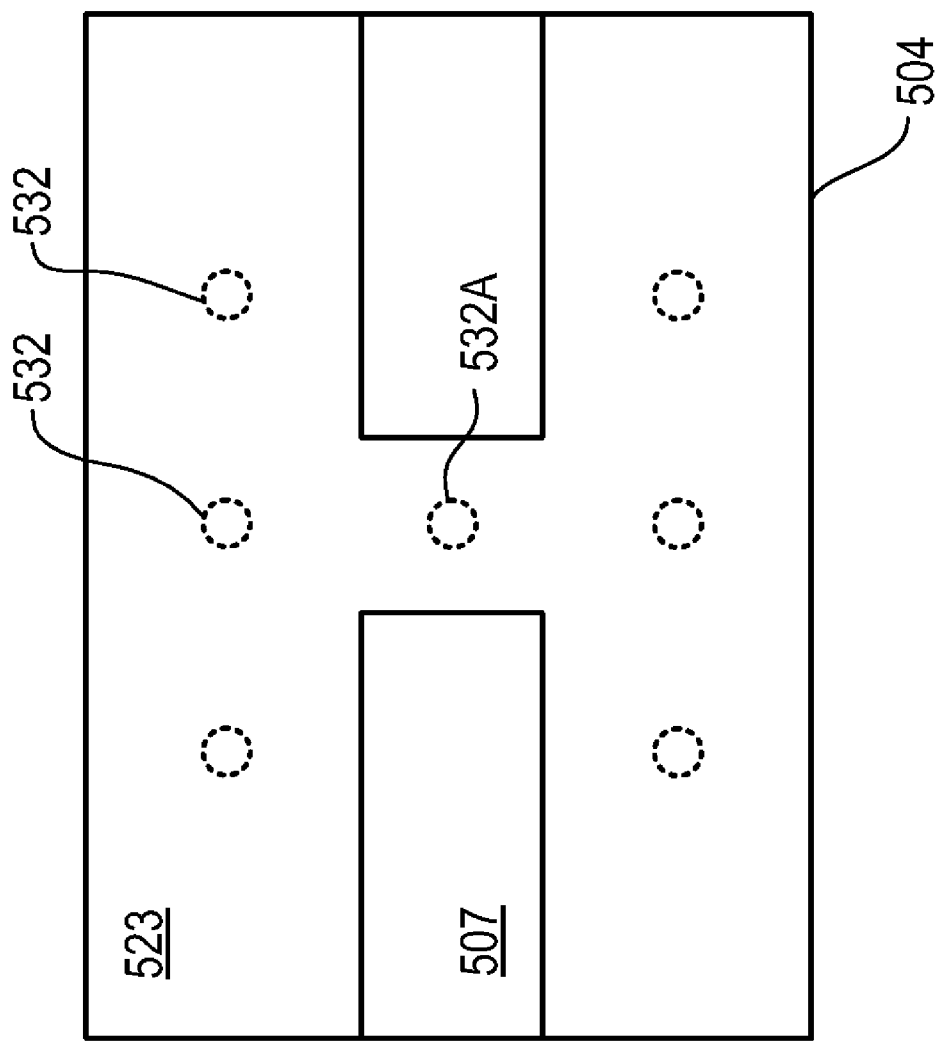

Refer now to FIGS. 5A-5C, which show different views of a stacked IC structure 500 having a CPW-over-ground to a CPW-over-ground transition. FIG. 5A is a cross-sectional view of the stacked IC structure 500, and FIG. 5B is an exploded view of the stacked IC structure 500. FIG. 5C is a bottom view of an IC 502 in the stacked IC structure 500. FIG. 5D is a bottom view of a substrate 504 in the stacked IC structure 500.

The stacked IC structure 500 includes an IC 502, a substrate 504, and a package 506. The IC 502 has a front side 508 and a back side 510. A CPW-over-ground 512 is formed on the front side 508. The CPW-over-ground 512 includes a center conductor 512A and outer conductors 512B. Contact pads 514 and a ground plane 518 are formed on the back side 510 of the IC 502. Through-chip vias 516 connect the center conductor 512A to each contact pad 514. Additional through-chip vias 517 connect the outer conductors 512B to the ground plane 518. Generally, enough through-chip vias 517 should be used to provide enough heat flow from the IC 502 to the substrate 504, and to prevent undesired modes.

The substrate 504 has a front surface 505 and a back surface 507. The substrate 504 has a CPW-over-ground 512 formed on its front surface 505. The substrate CPW-over-ground includes center conductors 520A and an outer conductor 520B. A ground plane 523 can be formed on the back surface 507 (optional). Conductive vias 532 are formed through the substrate 504 in various locations within the outer conductor 520B and connect the outer conductor 520B on the front surface 505 to the ground plane 523 on the back surface 507. Alternatively, if no ground plane 523 is formed, the conductive vias 532 connect the outer conducter 520B to pads on the back surface 507 of the substrate 504. These conductive vias 532 provide a grounding and heat flow path to the package 506 (described in more detail below) for the outer conductor 520B on the substrate 504 and the outer conductors 512B on the IC 502 when the substrate and IC are stacked and packaged. At least one of the conductive vias 532A is placed below the ground plate 518 of the IC 502, to provide grounding and a heat-dissipation path between the IC 502 and the package 506. Generally, enough conductive vias 532 should be used to provide enough heat flow from the substrate 504 to the package 506, and to prevent undesired modes.

The IC 502 is stacked onto the substrate 504 and connected using conductive bonds 524 between the contact pads 514 and the substrate inner conductor 520A. An additional conductive bond 530 is made between the ground plane 518 and the outer conductor 520B on the substrate. The conductive bond 530 contacts the conductive via 532A as well as the outer conductor 520B, and completes the ground interconnection between the IC 502, substrate 504, and the package 506.

Once stacked together, the IC 502 and substrate 504 are placed into the package 506. The substrate 504 can contact the package 506 in several ways as described earlier. The substrate 504 and package 506 can be bonded together with conductive epoxy, solder or other conductive material. The substrate 504 can also be mechanically held in place with a heat conductive paste or a compressible conductive film.

Stacked IC Structure with Multiple Integrated Circuits

Figure 6A:
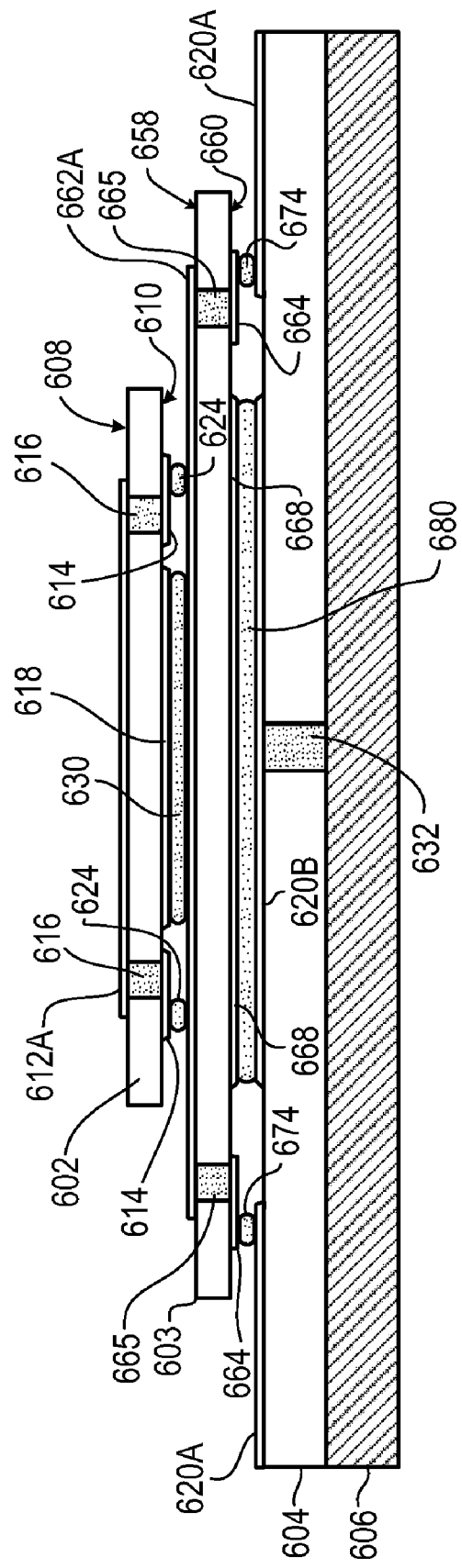
FIGS. 6A-6B show different views of a stacked IC structure having multiple integrated circuits stacked together.
Figure 6B:
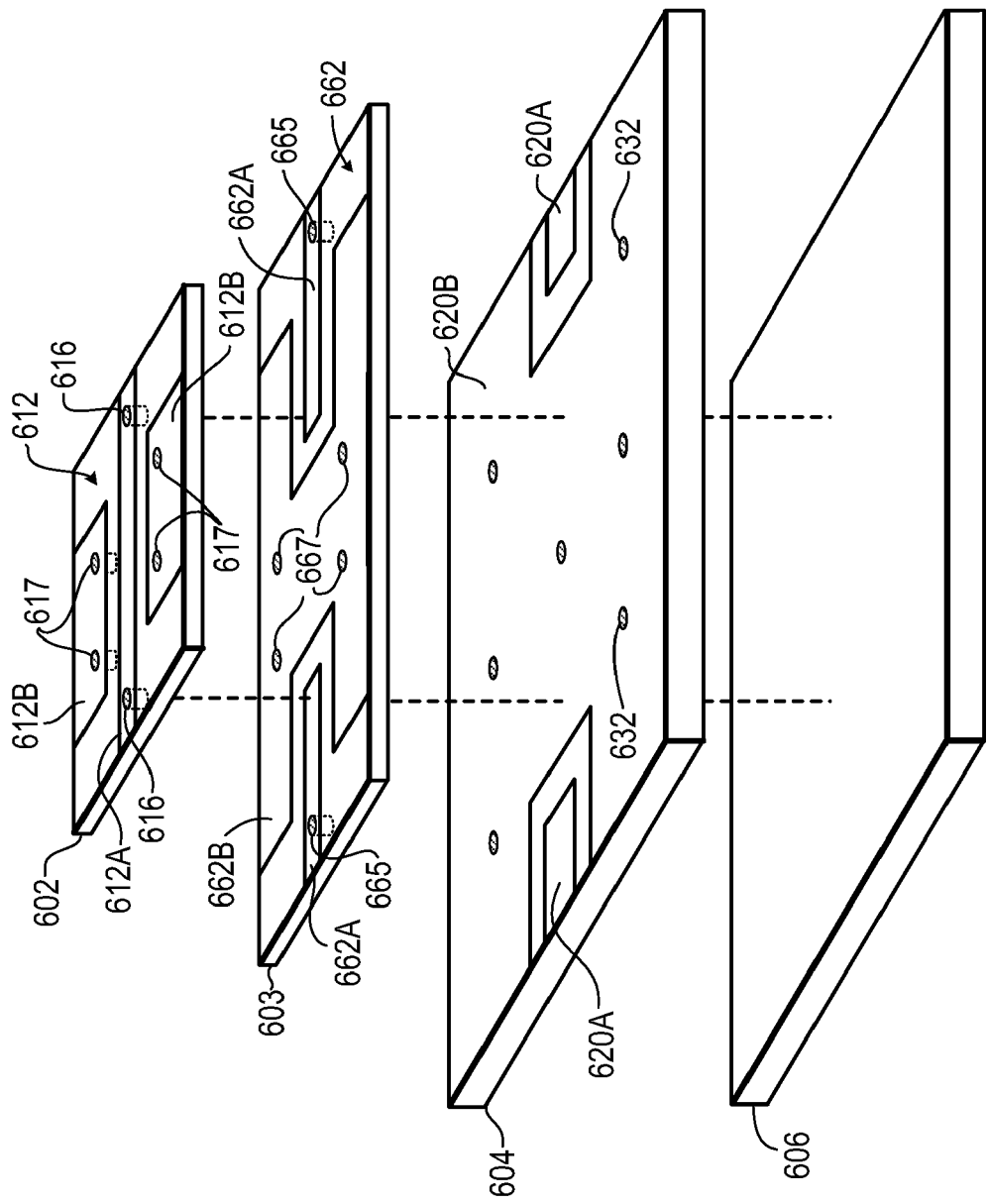

The stacked IC structure can be extended to include additional layers. Refer now to FIGS. 6A-6B, which show different views of a stacked IC structure 600 having multiple integrated circuits stacked together. FIG. 6A is a cross-sectional view of the stacked IC structure 600, and FIG. 6B is an exploded view. FIG. 5C is also a bottom view of a first and second IC in the stacked IC structure.

The stacked IC structure 600 includes a first IC 602, a second IC 603, a substrate 604, and a package 606. The first IC 602 has a front side 608 and a back side 610. A CPW over ground 612 is formed on the front side 608. The CPW 612 includes a center conductor 612A and outer conductors 612B. Contact pads 614 and a ground plane 618 are formed on the back side 610 of the IC 602. A bottom view of the first IC 602 is shown in FIG. 5C. Through-chip vias 616 connect the center conductor 612A to the contact pads 614. Additional through-chip vias 617 connect the outer conductors 612B to the ground plane 618.

A second IC 603 has a front side 658 and a back side 660. A CPW over ground 662 is formed on the front side 658. The CPW 662 includes center conductors 662A and an outer conductor 662B. Contact pads 664 and a ground plane 668 are formed on the back side 660 of the second IC 603. A bottom view of the second IC 603 is shown in FIG. 5C. Through-chip vias 665 connect the center conductor 662A to the contact pads 664. Additional through-chip vias 667 connect the outer conductor 662B to the ground plane 668 on the second IC 603.

The first IC 602 is stacked onto the second IC 603 and connected using conductive bonds 624 between the contact pads 614 on the first IC and the center conductors 662A of the second IC. In this manner, the center conductor 612A on the first IC 602 is interconnected to the center conductor 662A on the second IC 603. An additional connection is made using a conductive bond 630 between the ground plane 618 on the first IC 602 and the outer conductor 662B on the second IC 603.

The substrate 604 has a CPW 620 formed on its front surface. The substrate CPW 620 includes a center conductor 620A and an outer conductor 620B. Conductive vias 632 are formed through the substrate 604 in various locations within the outer conductor 620B. When the substrate 604 and IC 602 are stacked and housed in a package, these conductive vias 632 complete an interconnection to package ground for the outer conductor 620B, the outer conductors 667 on the second IC, and the outer conductors 617 on the first IC.

The first IC 602 and second IC 603 are stacked onto the substrate 604 and connected using conductive bonds 674 between the contact pads 664 on the second IC and the center conductor 620A on the substrate. An additional connection is made using a conductive bond 680 between the ground plane 668 on the second IC 603 and the outer conductor 620B on the substrate 604. The stacked first IC 602, second IC 603, and substrate 604 are then connected to package 606 in a manner as previously described.

The attachment of the ICs, substrate, and package to one another does not need to happen in the order described above. Attachment can occur in any suitable order, or all of the components can be connected together at once, depending on what kind of attachment equipment is used.

Stacked IC Structure with Patterned Ground Plane

Figure 7:
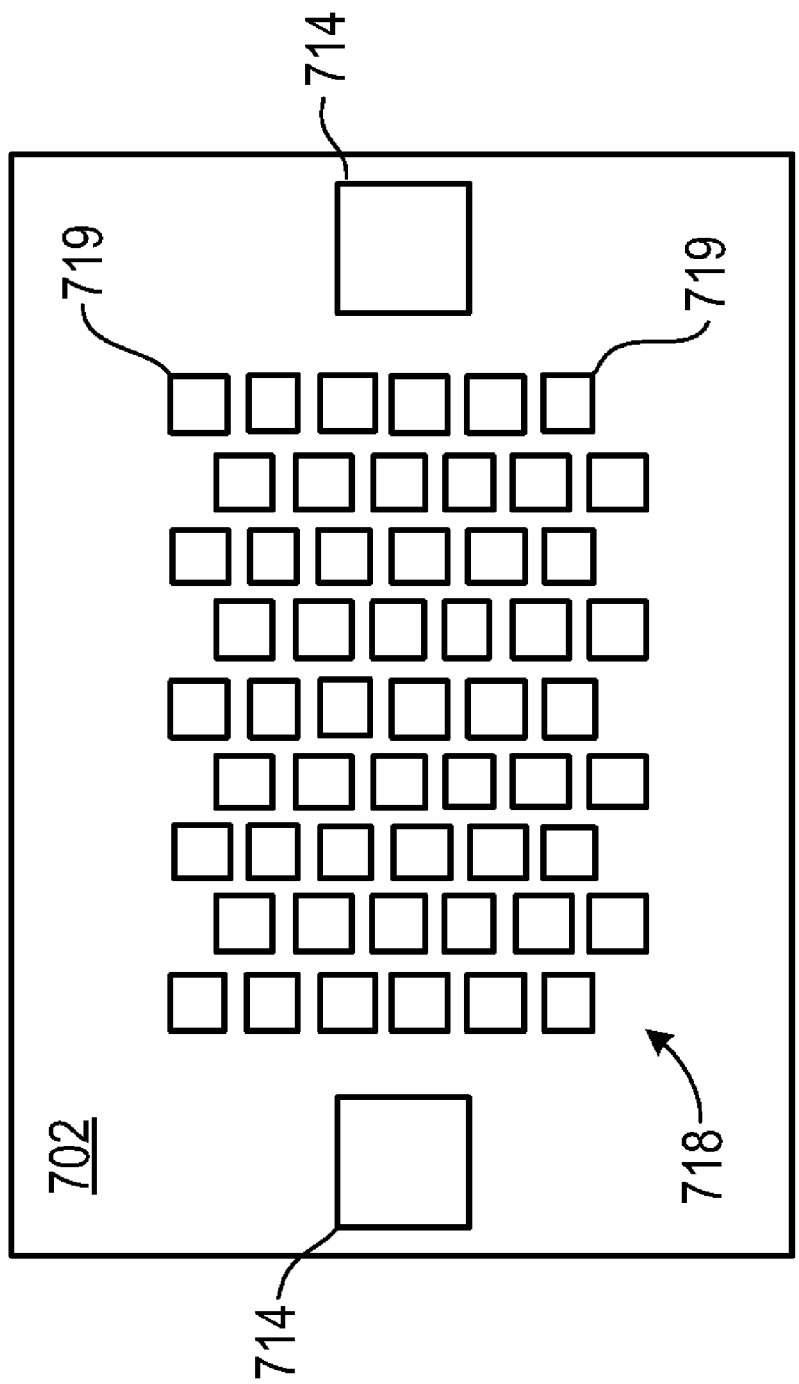
FIG. 7 shows a bottom view of an IC having a patterned ground plane.

The ground plane on the backside of the IC has been shown in the above embodiments as a solid plating of metal. The ground plane can also be implemented using a pattern of multiple metal pads. Refer now to FIG. 7, which shows a bottom view of an IC 702 having a patterned ground plane 718.

The IC 702 has a patterned ground plane 718 on its back side. The patterned ground plane 718 consists of an array of metal pads 719. In one embodiment, the metal pads 719 are plated gold posts. Contact pads 714 are also formed on the back side of the IC 702.

The thermal conductance of a ground plane is degraded when the patterned ground plane 718 is used instead of a continuous plating of metal. However, when the metal pads 719 in the patterned ground plane 718 are gold posts, the IC 702 can be attached to a substrate using thermosonic bonding. Other material suitable for thermosonic bonding can also be used in the metal pads 719. Solder bumps, metal pads with conductive epoxy, or other conductive material can also be used, although not necessarily in conjunction with a thermosonic bonding technique.

Although the present invention has been described in detail with reference to particular embodiments, persons possessing ordinary skill in the art to which this invention pertains will appreciate that various modifications and enhancements may be made without departing from the spirit and scope of the claims that follow.

What is claimed is:

1. A stacked IC structure, comprising:
    an integrated circuit (IC) having a front IC side, a back IC side, and a first conductive feature formed on the front IC side;
    a through-chip via connected to the first conductive feature on the front IC side;
    a substrate having an external circuit formed on a front surface, wherein the IC attaches to the front surface of the substrate and the through-chip via forms a connection between the first conductive feature and the external circuit;
    a ground plane on the back IC side;
    a package housing the IC and the substrate: and
    a heat dissipation path between the ground plane and the package.

2. A stacked IC structure as in claim 1, further comprising:
    a pedestal in the package, wherein the pedestal connects to the ground plane through a cutout in the substrate.

3. A stacked IC structure as in claim 1, the heat dissipation path further comprising:
   a substrate pad integrally formed on the front surface of the substrate; and
   vias within the substrate pad coupling the ground plane to the package.

4. A stacked IC structure as in claim 1, the external circuit on the substrate further comprising a transmission line.

5. A stacked IC structure as in claim 4, wherein the transmission line is a type selected from the group consisting of: microstrip, coplanar waveguide, coplanar strip, and stripline.

6. A stacked IC structure as in claim 1, the external circuit on the substrate further comprising a substrate coplanar waveguide (CPW).

7. A stacked IC structure as in claim 6, wherein the substrate CPW comprises:
   a substrate center conductor coupled to the first conductive feature by the through-chip via; and
   a substrate outer conductor coupled to the ground plane.

8. A stacked IC structure as in claim 7, wherein the first conductive feature is a transmission line.

9. A stacked IC structure as in claim 7, wherein the first conductive feature is a center conductor of an IC CPW.

10. A stacked IC structure as in claim 7, wherein vias within the outer conductor coupling the ground plane to the package.

11. A stacked IC structure as in claim 1, the first conductive feature on the IC further comprising a transmission line.

12. A stacked IC structure as in claim 11, wherein the transmission line is a type selected from the group consisting of: microstrip, coplanar waveguide, coplanar strip, and stripline.

13. A stacked IC structure as in claim 11, the first conductive feature on the IC further comprising an IC CPW having an IC center conductor and an IC outer conductor, wherein the IC center conductor is coupled to the external circuit by the through-chip via.

14. A stacked IC structure as in claim 13, further comprising:
   a second through-chip via formed between the IC outer conductor and the ground plane.

15. A stacked IC structure as in claim 14, further comprising adjustments in the ground plane to maintain a set distance between the through-chip via and the ground plane.

16. A stacked IC structure as in claim 1, wherein the substrate is a printed circuit board.

17. A stacked IC structure as in claim 1, wherein the substrate is another integrated circuit.

18. The stacked IC structure of claim 1, wherein the IC comprises a back IC surface on the back IC side, and wherein the ground plane is provided directly on the back IC surface.

19. The stacked IC structure of claim 1, wherein the IC comprises a front IC surface on the front IC side, and wherein the first conductive feature is provided directly on the front IC surface.

20. The stacked IC structure of claim 19, wherein the through-chip via passes completely through the IC from the front IC surface to the back IC surface, and is directly connected to the first conductive feature provided directly on the front IC surface and is also directly connected to a contact pad provided directly on the back IC surface.

* * * * *